(12) United States Patent
Yamamoto

(10) Patent No.: US 7,176,666 B2
(45) Date of Patent: Feb. 13, 2007

(54) DC REGULATED POWER SUPPLY COMPRISING

(75) Inventor: Shinzou Yamamoto, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/137,343

(22) Filed: May 26, 2005

(65) Prior Publication Data

US 2005/0213276 A1 Sep. 29, 2005

Related U.S. Application Data

(62) Division of application No. 10/608,565, filed on Jun. 30, 2003, now Pat. No. 6,914,421.

(30) Foreign Application Priority Data

Jul. 16, 2002 (JP) .............................. 2002-207133

(51) Int. Cl.
 *G05F 1/40* (2006.01)
 *H02H 7/00* (2006.01)
 *H03K 17/74* (2006.01)
(52) U.S. Cl. ...................................... 323/282; 361/18
(58) Field of Classification Search ................ 323/268, 323/271, 272, 275–282, 285, 289; 361/13, 361/18, 54, 86, 88, 89, 93.8, 94, 103
See application file for complete search history.

(56) References Cited

U.S. PATENT DOCUMENTS 3,916,256 A * 10/1975 Kotani ........................ 361/103
4,090,123 A    5/1978 Kiviranna
4,127,885 A *  11/1978 Adam et al. ................... 361/18
4,510,563 A *  4/1985 Sato ............................ 363/20
4,694,223 A *  9/1987 Campolo ..................... 315/118
5,453,904 A    9/1995 Higashiyama et al.
5,642,027 A    6/1997 Windes et al.
6,982,860 B2 * 1/2006 Smith et al. ................. 361/119

FOREIGN PATENT DOCUMENTS

JP         2625687 B2    4/1997

* cited by examiner

*Primary Examiner*—Matthew V. Nguyen
(74) *Attorney, Agent, or Firm*—Birch, Stewart, Kolasch and Birch, LLP

(57) ABSTRACT

A DC regulated power supply includes: a power transistor provided for each output of a plurality of systems; a control IC, which compares a feedback value of an output voltage and a reference voltage from a reference voltage source, and controls a base current of the power transistor according to a difference of the feedback value and the reference voltage, so as to regulate the output voltage; and an overheat protection circuit, which lowers the reference voltage of the reference voltage source upon detecting an overheated state in the power transistor. The DC regulated power supply is able to simultaneously suppress transistor base currents of different systems and eliminate regulation malfunctions in the overheat protection operation, thereby suppressing fluctuations of output voltage.

6 Claims, 8 Drawing Sheets

DC REGULATED POWER SUPPLY COMPRISING

CROSS-REFERENCE TO RELATED APPLICATION

This application is a Divisional of application Ser. No. 10/608,565, filed on Jun. 30, 2003, now U.S. Pat. No. 6,914,421 the entire contents of which are hereby incorporated by reference and for which priority is claimed under 35 U.S.C. § 120.

FIELD OF THE INVENTION

The present invention relates to a DC regulated power supply of a dropper-type, known as a series regulator, and particularly to a structure for the protection against overheating in such a DC regulated power supply with outputs of plural systems.

BACKGROUND OF THE INVENTION

FIG. 6 is a block diagram illustrating a basic electrical structure of a dropper-type DC regulated power supply 1. The DC regulated power supply 1 is a three-terminal regulator with a single output, in which a power transistor q is interposed in series on a power line 1 that connects a power supply with a load (neither is shown). The base current of the power transistor q is controlled by a control IC ctl. In this way, an output voltage vo is adjusted to an output voltage level that has been set beforehand according to the load requirement, thereby generating a stable DC voltage.

In the control IC ctl, a differential amplifier a compares a reference voltage vref from a reference voltage source 2 with a feedback voltage vadj, the reference voltage source 2 being provided either internally or externally to the control IC ctl (internally in the example shown in FIG. 6), and the feedback voltage vadj being produced by dividing the output voltage vo through resistors r1, r2. By thus comparing the two voltages, the differential amplifier a controls the base current of the power transistor q via a control transistor tr, so as to match the two voltages. On the output side of the power transistor q is provided an output capacitor (not shown) for smoothing the output.

The DC regulated power supply 1 with the described structure generally includes a protection circuit, such as an overcurrent protection circuit b and an overheat protection circuit 3, by which the base current of the power transistor q is reduced when an overcurrent flows or when there is a temperature increase in the series regulator, so as to protect the DC regulated power supply 1.

However, the DC regulated power supply 1 has a drawback in that the operation of the protection circuit influences other output systems when the output of more than one system is packed and sealed in a single package. This is due to the fact that the DC regulated power supply 1 is a single-output regulator, whereby the circuits of each functional block are designed for single output.

FIG. 7 is a block diagram showing an electrical structure of a DC regulated power supply 11 with outputs of multiple systems (two systems in FIG. 7). The DC regulated power supply 11 is realized by connecting a plurality of DC regulated power supplies 1 of the single-output structure in parallel, using a common input. In FIG. 7, the same reference numerals are used for the constituting elements that were already described with reference to FIG. 6, and like elements are indicated by adding numbers.

In the DC regulated power supply 11 having the foregoing structure, upon detecting an overcurrent state, overcurrent protection circuits b1, b2 bypass the base currents that are respectively supplied from differential amplifiers a1, a2, so as to control transistors tr1, tr2. This reduces the base currents of the corresponding power transistors q1, q2, thereby carrying out the protection operation.

Similarly, when an overheated state is detected in the overheat protection circuit 3, the base currents supplied to the control transistors tr1, tr2 are bypassed to reduce the base currents of the power transistors q1, q2, thereby carrying out the protection operation.

Thus, in the DC regulated power supply 11, reducing the base currents by the overheat protection circuit 3 in an overheated state effects the overheat protection operation only in one of the systems, owning to differences in circuit constant or load condition, i.e., differences in threshold of the transistors due to different values of the base currents, which shifts the temperature (timing) of reducing the base currents from each other.

Here, fluctuations of the driving current causes the driving current of the other system to fluctuate, causing the output voltage to fluctuate. Particularly, when the output voltage increases and exceeds an acceptable voltage range of the load, the load may be damaged.

The overheat protection circuits of the DC regulated power supply 11 operate when the temperature exceeds an overheat protection temperature. Below the overheat protection temperature, the overheat protection circuits do not operate and the DC regulated power supply 11 carries out normal regulation operation.

As described above, the overheat protection circuits of the DC regulated power supply 11 operate at different timings. Accordingly, when the overheat protection circuits operate in response to generated heat of the regulator and when the overheat protection operation becomes effective only in one of the systems under a maintained device temperature in the vicinity of the overheat protection temperature, the output of the protected system may place the other system under the influence of driving current fluctuations for an extended period of time.

Such a phenomenon is especially prominent when one of the systems has an excessively small output current and the overheat protection circuit operates in response to generated heat caused by the output current of the other system. FIG. 8 describes how this gives rise to malfunctions, with reference to respective waveforms of chip temperature, output voltage, output current, and input current.

When the output current of one system is excessively small, the overheat protection circuit of the other system that has generated heat operates and reduces only the current of the output that generated heat. Here, when the output current becomes temporarily dull, the input current also becomes dull if the capacity of the power supply is not sufficient. The output with excessively small output current becomes more susceptible to the influence of the dull input current as the current becomes smaller. This may result in regulation control failure or regulator malfunction. In the worst case, the output voltage vo increases above the pre-set voltage to cause damage to the load devices. Thus, the multi-output regulator needs to be designed such that the operation of one system does not affect the operations of the other systems.

This is particularly true in one-chip configuration. Depending on the layout of a semiconductor circuit block, operations of the control IC or protection circuit of one system may cause potential fluctuations due to heat transfer or current flow even when the other systems are not operating. This becomes more likely as the circuit distance within the chip becomes shorter. Further, even when the circuit design is the same, a common circuit component may cause differences in circuit constant due to a distance therefrom or due to asymmetricity of the circuit. It is therefore required that the circuits be designed to minimize the influence of one system over another.

SUMMARY OF THE INVENTION

It is an object of the present invention to provide a DC regulated power supply that can suppress fluctuations of output voltage caused by regulation malfunctions in overheat protection operation.

In order to achieve the foregoing object, a DC regulated power supply of the present invention includes: a power transistor provided for each output of a plurality of systems; a control circuit, which compares a feedback value of an output voltage and a reference voltage from a reference voltage source, and controls a base current of the power transistor according to a difference of the feedback value and the reference voltage, so as to regulate the output voltage; and an overheat protection circuit, which lowers the reference voltage of the reference voltage source upon detecting an overheated state in the power transistor.

With this configuration, a DC regulated power supply of a dropper type can be realized that includes: outputs of multiple systems; a power transistor serially interposed for each output on a power line that connects a DC power supply with a DC load; and a control circuit, which compares a feedback value that is obtained from the output voltage with a reference voltage from a reference voltage source, and controls a base current of the power transistor according to the difference and thereby controls the ON resistance of the power transistor, so as to regulate the output voltage. The feedback value may be obtained by dividing the output voltage through the resistors.

With this configuration, in carrying out the overheat protection operation, the overheat protection circuit of the present invention suppresses the output current by lowering the reference voltage. This contrasts to conventional overheat protection circuits, which suppress the base current of the power transistor to suppress the output current.

The present invention is therefore able to simultaneously suppress the base currents of different systems and eliminate regulation malfunctions in the overheat protection operation, thereby suppressing fluctuations of output voltage. The present invention is particularly suitable in applications where a control circuit with multiple systems are integrated into one chip and packaged into a single package with the power transistor.

In order to achieve the foregoing object, another DC regulated power supply of the present invention includes: a power transistor provided for each output of a plurality of systems; a control circuit, which compares a feedback value of an output voltage and a reference voltage from a reference voltage source, and controls a base current of the power transistor according to a difference of the feedback value and the reference voltage, so as to regulate the output voltage; and an overheat protection circuit, which cuts off a supply line of an input voltage to the power transistor upon detecting an overheated state in the power transistor.

With this configuration, a DC regulated power supply of a dropper type can be realized that includes: outputs of multiple systems; a power transistor serially interposed for each output on a power line that connects a DC power supply with a DC load; and a control circuit, which compares a feedback value that is obtained from the output voltage with a predetermined reference voltage, and controls a base current of the power transistor according to the difference and thereby controls the ON resistance of the power transistor, so as to regulate the output voltage. The feedback value may be obtained by dividing the output voltage through the resistors.

With this configuration, in carrying out the overheat protection operation, the overheat protection circuit of the present invention suppresses the output current by cutting off the supply line of an input voltage. This contrasts to conventional overheat protection circuits, which suppress the base current of the power transistor to suppress the output current.

The present invention is therefore able to suppress the regulation operation of the entire DC regulated power supply to prevent the regulation operation of one system from influencing the regulation operations of the other systems. This eliminates regulation malfunctions in the overheat protection operation, and thereby suppresses fluctuations of output voltage.

For a fuller understanding of the nature and advantages of the invention, reference should be made to the ensuing detailed description taken in conjunction with the accompanying drawings.

DESCRIPTION OF THE EMBODIMENTS

[First Embodiment]

Figure 1:
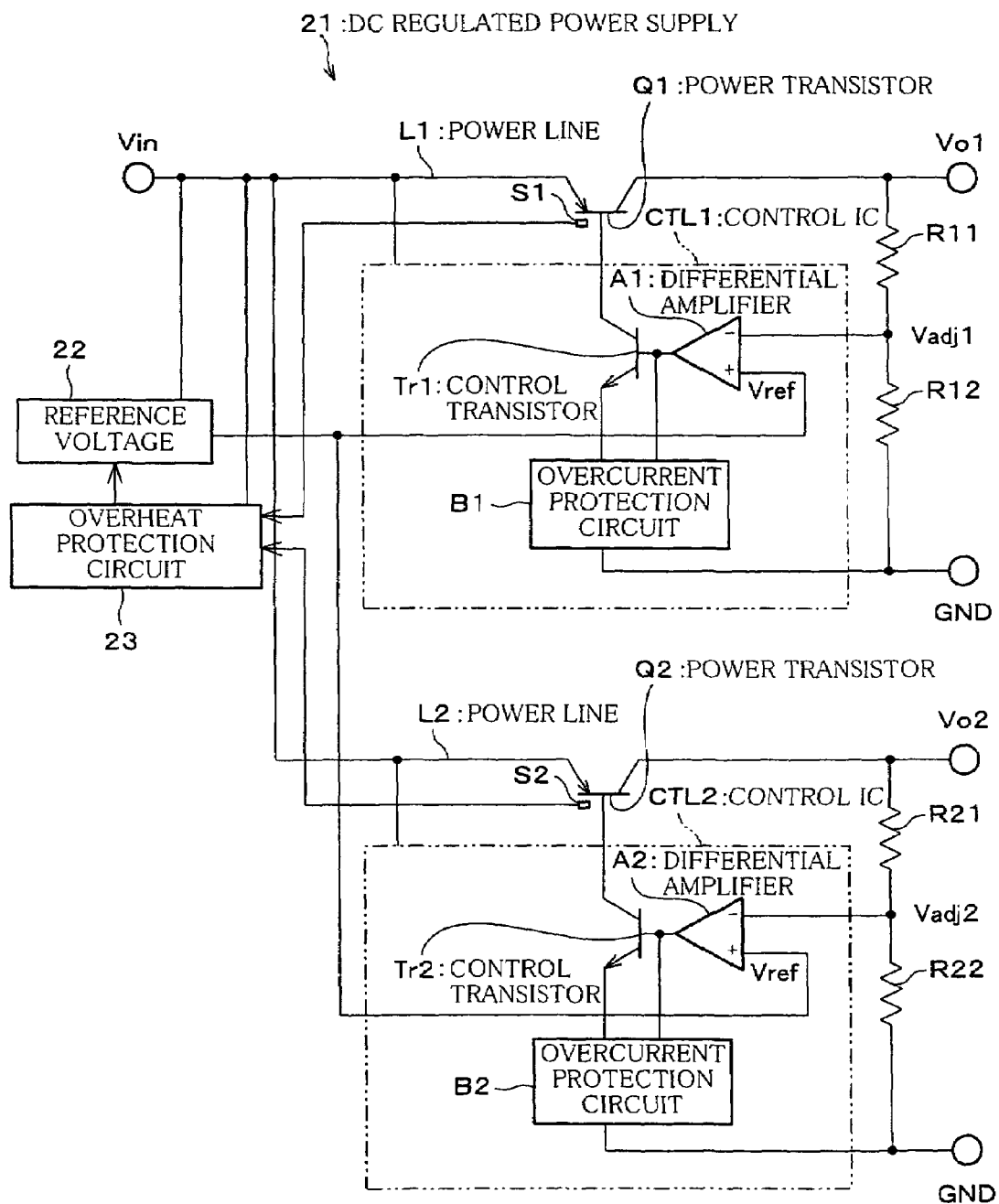
FIG. 1 is a block diagram showing an electrical structure of a DC regulated power supply of a First Embodiment of the present invention.

Referring to FIG. 1, the following describes one embodiment of the present invention.

FIG. 1 is a block diagram illustrating an electrical structure of a DC regulated power supply 21 of the First Embodiment of the present invention. The DC regulated power supply 21 is a regulated power supply of a dropper type, in which output voltages Vo1, Vo2 of two systems are produced from a common input voltage Vin.

The output voltages Vo1, Vo2 of two systems may have the same level or different levels. Likewise, the current capacitance may be the same or different. Further, the number of systems is not just limited to two, and outputs of three or more systems may be used.

Power transistors Q1, Q2 are serially and respectively connected to power lines L1, L2 that connect a common power supply (not shown) to their respective loads. Control ICs CTL1, CTL2 are provided to control the base currents of the power transistors Q1, Q2, respectively. By controlling the base currents of the power transistors Q1, Q2, the control ICs CTL1, CTL2 adjust the output voltages Vo1, Vo2 to output voltage levels that have been set beforehand according to the load requirement, and thereby generate stable DC voltages for the respective systems.

In the control IC CTL1, as in the control IC ctl, a differential amplifier A1 compares a reference voltage Vref from a reference voltage source 22 with a feedback voltage Vadj1 that has been produced by dividing the output voltage Vo1 through resistors R11 and R12. By thus comparing the two voltages, the differential amplifier A1 controls the base current of the power transistor Q1 via a control transistor TR1, so as to match the two voltages.

Similarly, in the control IC CTL2, a differential amplifier A2 compares a reference voltage Vref from the reference voltage source 22 with a feedback voltage Vadj2 that has been produced by dividing the output voltage Vo2 through resistors R21 and R22. By thus comparing the two voltages, the differential amplifier A2 controls the base current of the power transistor Q2 via a control transistor TR2, so as to match the two voltages.

The input voltage Vin supplies power to the circuits in the control ICs CTL1, CTL2. On the output sides of the power transistors Q1, Q2 are respectively provided output capacitors (not shown) for smoothing outputs.

The control ICs CTL1, CTL2 further include overcurrent protection circuits B1, B2, respectively. The overcurrent protection circuits B1, B2 detect the base currents of the power transistors Q1, Q2 from the emitter currents of the control transistors TR1, TR2. That is, the output currents of the power transistors Q1, Q2 are detected. When the detected output currents are at or greater than a predetermined level, the overcurrent protection circuits B1, B2 bypass the base currents that are supplied from the differential amplifiers A1, A2 to the control transistors TR1, TR2, so as to effect the overcurrent protection operation for suppressing output current.

The control ICs CTL1, CTL2 are externally provided with an overheat protection circuit 23. The overheat protection circuit 23 includes temperature detecting elements S1, S2, respectively corresponding to the power transistors Q1, Q2. The temperature detecting elements S1, S2 are respectively provided in the vicinity of the power transistors Q1, Q2. The overheat protection circuit 23, upon detecting an overheated state in at least one of the power transistors Q1, Q2, lowers the reference voltage Vref from the reference voltage source 22.

In this way, it is possible to simultaneously suppress the base currents of the power transistors Q1, Q2 of the two systems, so as to prevent regulation malfunctions caused by overheat protection operation, thereby suppressing fluctuations of the output voltages Vo1, Vo2.

The power transistors Q1, Q2, the control ICs CTL1, CTL2, the resistors R11, R12, and R21, R22, the reference voltage source 22, and the overheat protection circuit 23 are packed and sealed in a single package. This is highly advantageous in miniaturizing the device and saving space therefor. Further, because the system responsible for the feedback of the output voltage during stable operation and for the current driving excludes the reference voltage source 22 and the overheat protection circuit 23, these components can be shared between the two output systems. This is even more advantageous for the miniaturization of the device.

[Second Embodiment]

The following describes another embodiment of the present invention.

Figure 2:
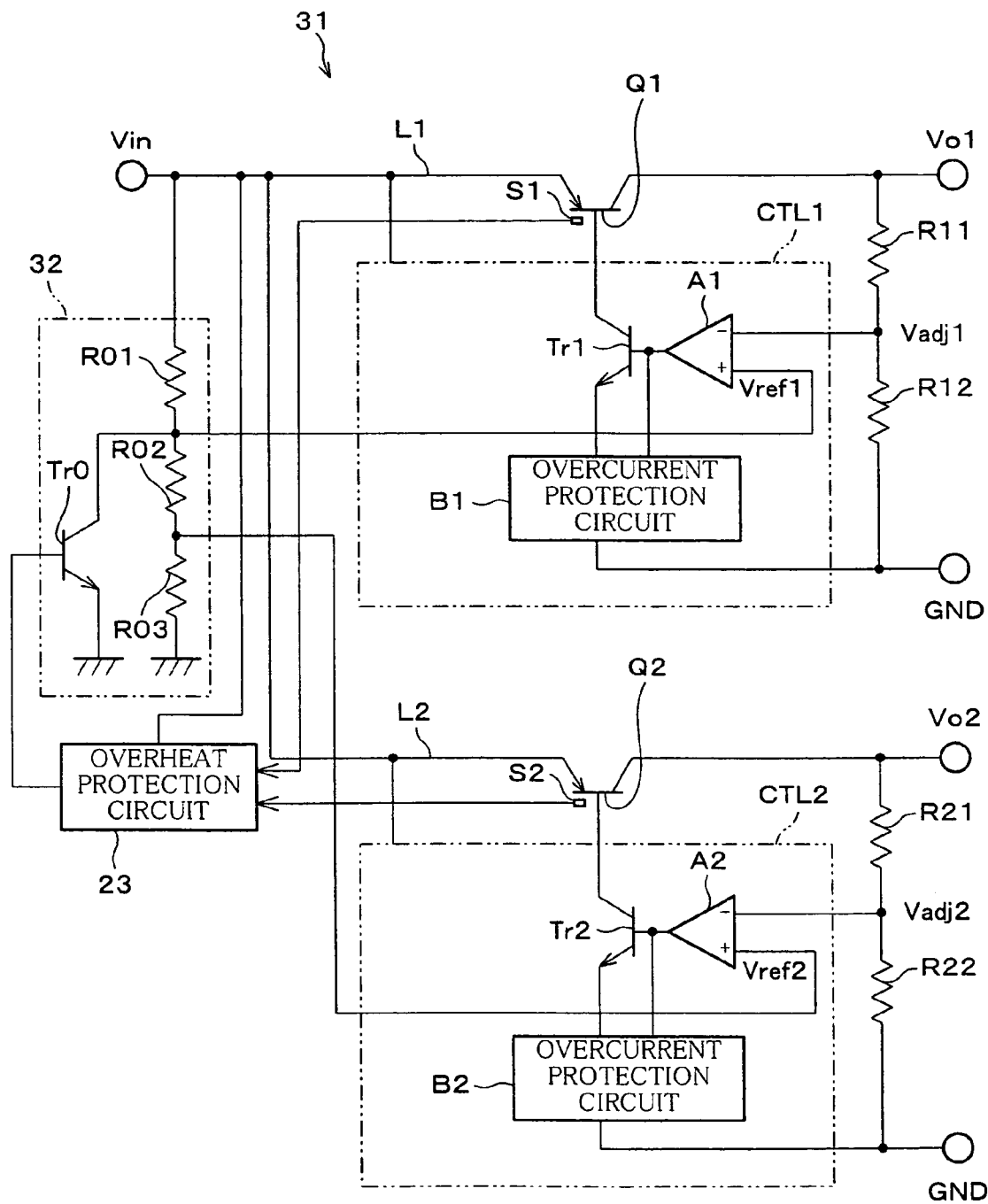
FIG. 2 is a block diagram showing an electrical structure of a DC regulated power supply of a Second Embodiment of the present invention.
Figure 3:
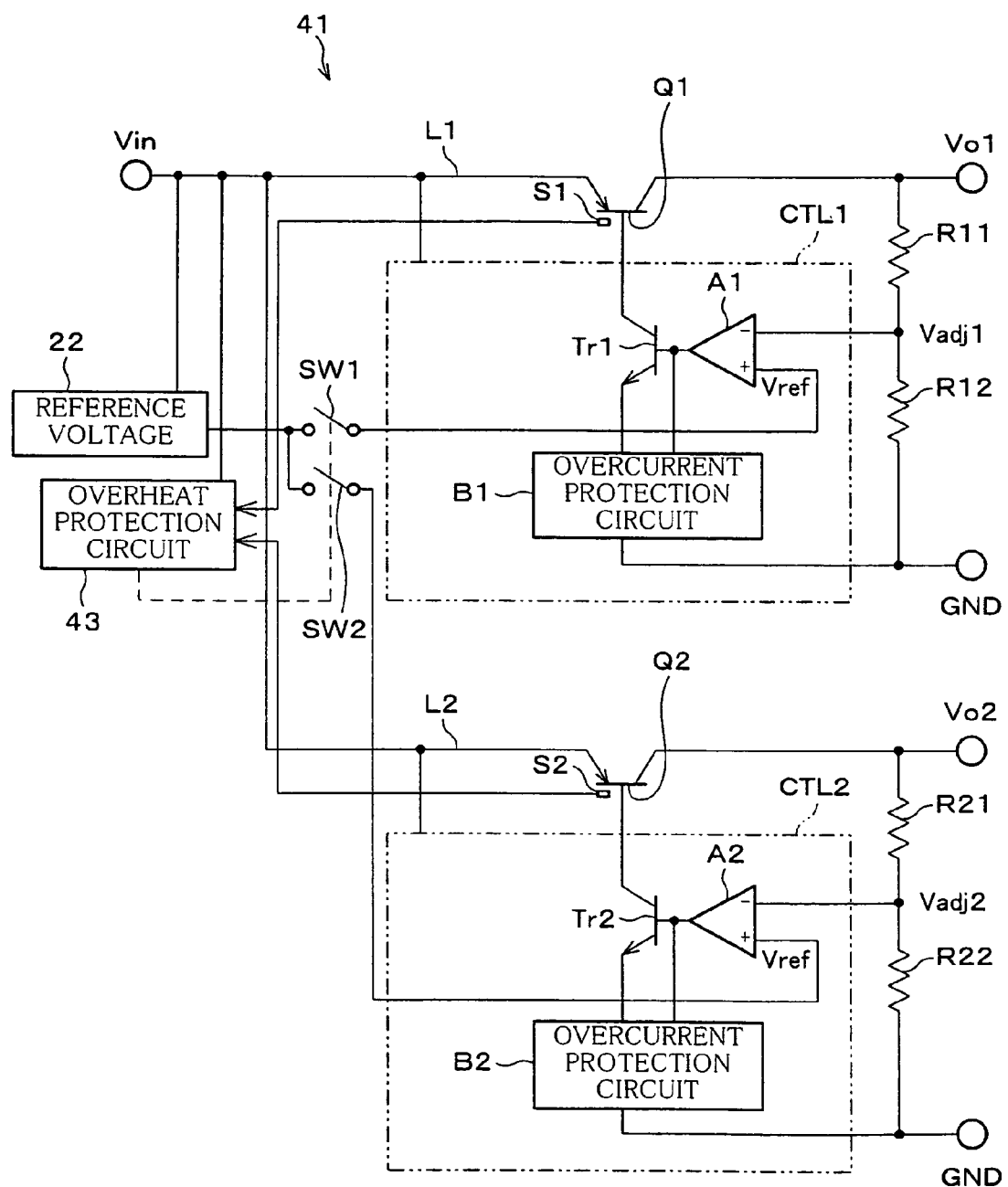
FIG. 3 is a block diagram showing an electrical structure of a DC regulated power supply of a Third Embodiment of the present invention.
Figure 4:
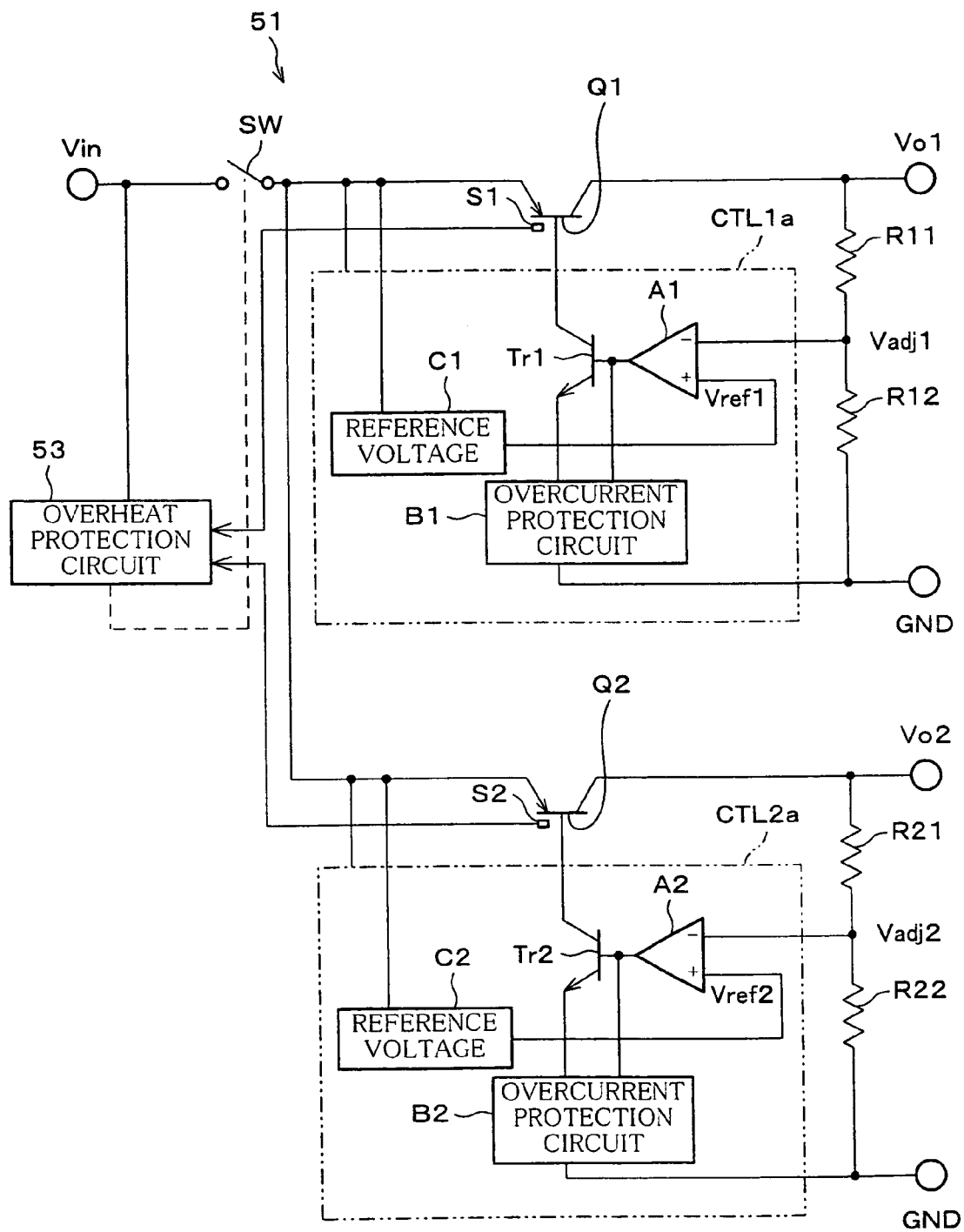
FIG. 4 is a block diagram showing an electrical structure of a DC regulated power supply of a Fourth Embodiment of the present invention.
Figure 5:
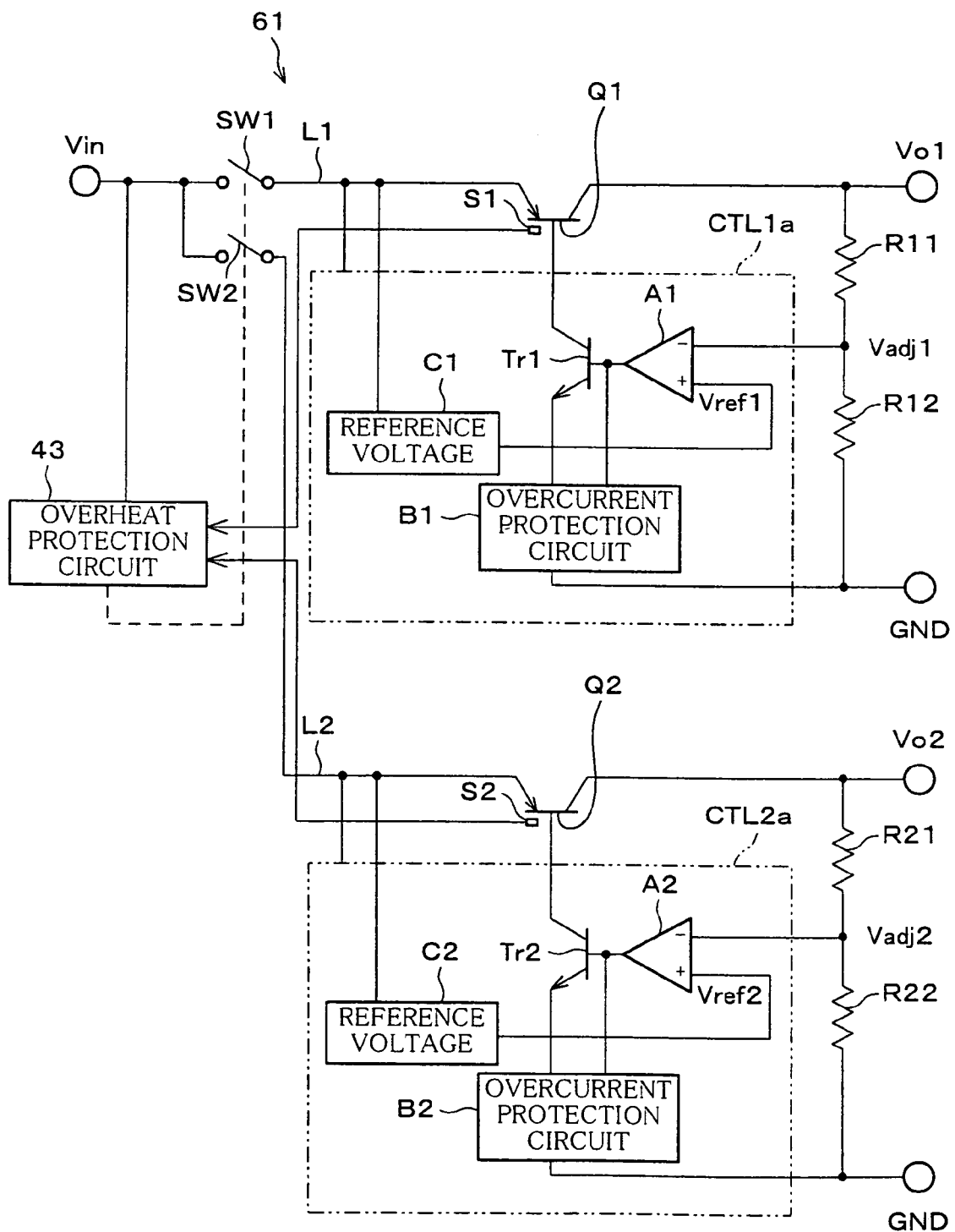
FIG. 5 is a block diagram showing an electrical structure of a DC regulated power supply of a Fifth Embodiment of the present invention.
Figure 6:
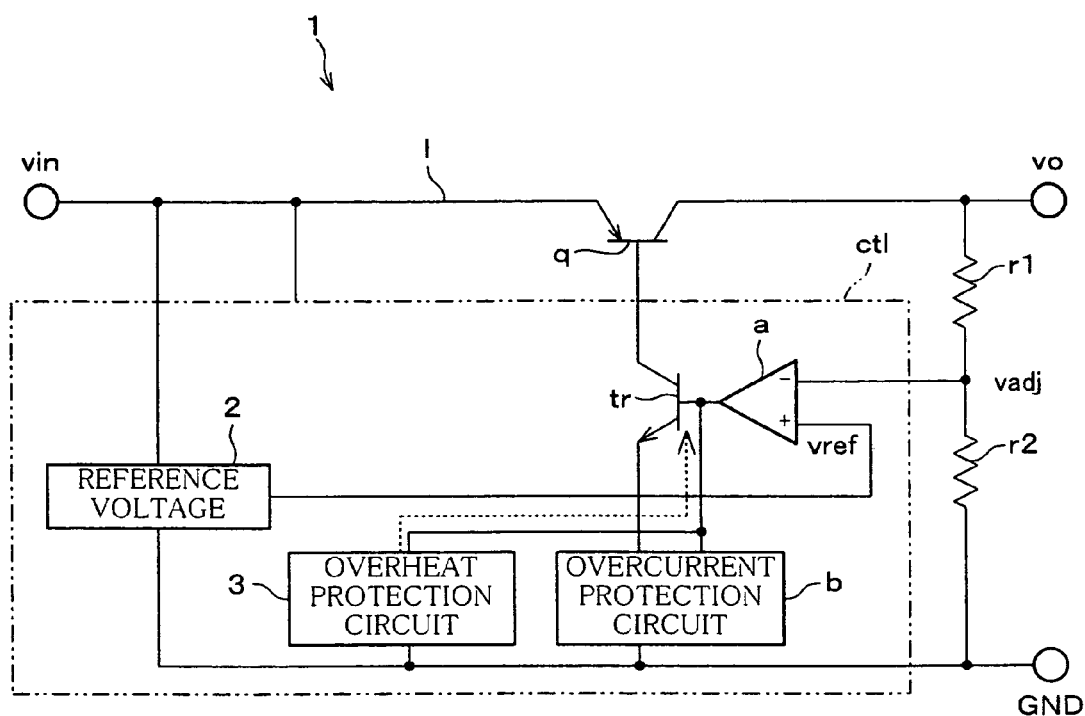
FIG. 6 is a block diagram showing a basic electrical structure of a DC regulated power supply of a dropper type.
Figure 7:
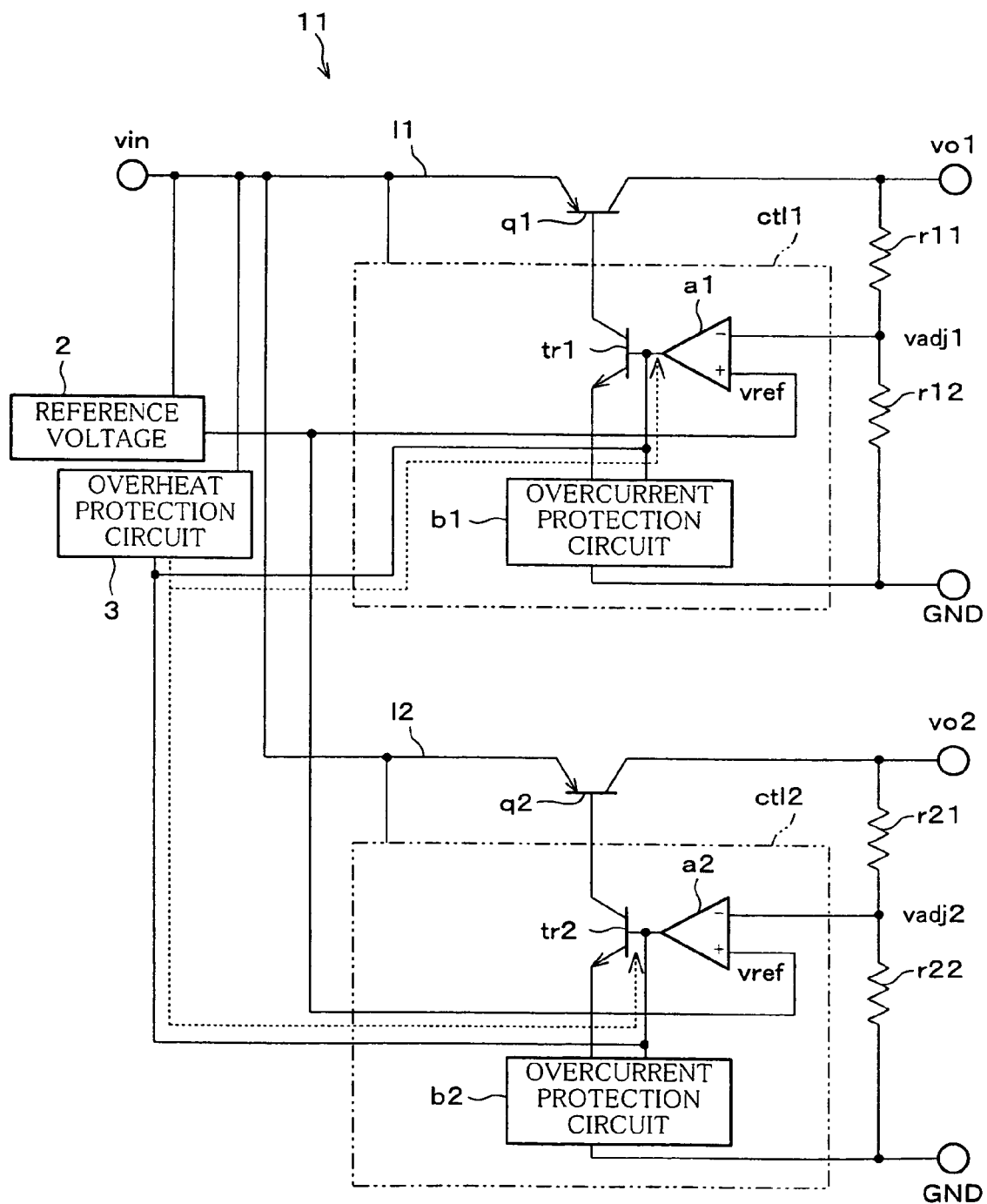
FIG. 7 is a block diagram showing an electrical structure of a DC regulated power supply with outputs of multiple systems.
Figure 8:
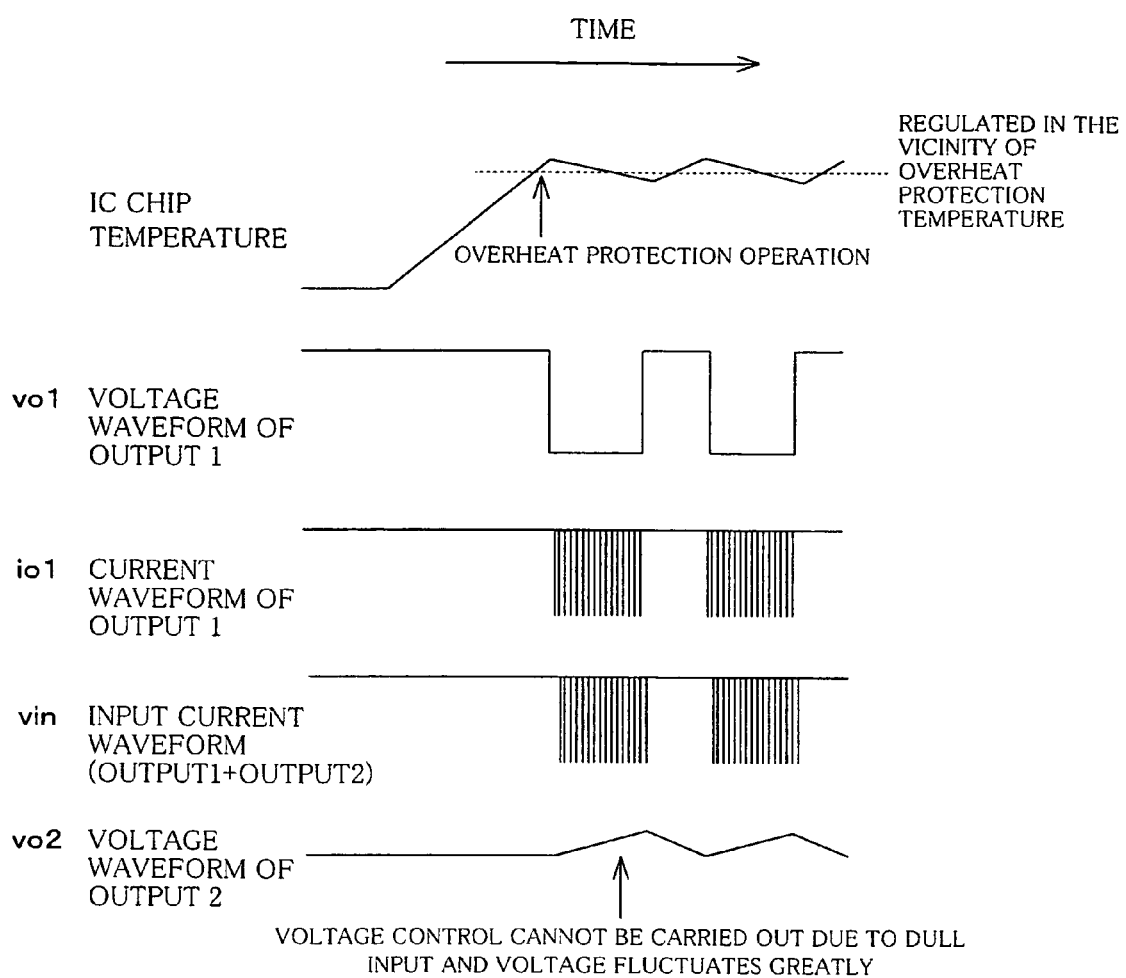
FIG. 8 is a waveform chart explaining operations of an overheat protection circuit.

FIG. 2 is a block diagram illustrating an electrical structure of a DC regulated power supply 31 of the Second Embodiment of the present invention. The DC regulated power supply 31 is similar to the DC regulated power supply 21, and accordingly corresponding elements are given the same reference numerals and explanations thereof are omitted here.

What should be noted about the DC regulated power supply 31 is that a reference voltage source 32 generates two reference voltages Vref1, Vref2, and supplies these voltages respectively to differential amplifiers A1, A2. In the example of FIG. 2, the voltages produced by dividing the input voltage Vin through resistors R01, R02, and R03 are Vref1 and Vref2, which are related to each other by Vref1>Vref2.

Further, in the reference voltage source 32, a control transistor Tr0 is provided parallel to the resistors R02, R03. The control transistor Tr0 is ON/OFF controlled by the output of the overheat protection circuit 23. When overheated, the control transistor Tr0 is turned on. This brings the reference voltages Vref1, Vref2 to GND level, causing the differential amplifiers A1, A2 to cut off the power transistors Q1, Q2 and thereby carrying out overheat protection operation.

With the overheated state solved, the control transistor Tr0 is turned off to revert from the protected state. In response, the reference voltage Vref1, which has a closer value to the input voltage Vin rises first before the reference voltage Vref2.

Thus, provided that the differential amplifiers A1, A2 have the same gain, by setting different values for the reference voltages Vref1, Vref2 of the respective output systems, i.e., by having different feedback voltages Vadj1, Vadj2, it is possible to cause the output voltages Vo1, Vo2 of the respective systems to rise at different timings in reverting from the protected state.

Note that, using capacitors for the resistors R02 and/or R03, it is possible to extend the delay time of rise in reverting from the overheat protected state, making it possible to vary the reverting timing according to the type of load. The delay time can be set with an RC constant of the resistor and capacitor.

[Third Embodiment]

The following describes an electrical structure of a DC regulated power supply 41 of the Third Embodiment of the present invention. The DC regulated power supply 41 is similar to the foregoing DC regulated power supply 21, and accordingly corresponding elements are given the same reference numerals and explanations thereof are omitted here.

What should be noted about the DC regulated power supply 41 is that switches SW1, SW2 are respectively provided for the lines of reference voltage Vref supplied to the differential amplifiers A1, A2 from the reference voltage source 22, and that the switches SW1, SW2 are controlled by the overheat protection circuit 43. Further, in addition to controlling the switches SW1, SW2, the overheat protection circuit 43 in the DC regulated power supply 43 is provided with a delay circuit, so as to vary ON timings of the switches SW1, SW2 when reverting to a normal state from an overheated state.

Thus, detecting an overheated state, the overheat protection circuit 43 opens the switches SW1, SW2, so as to suspend the regulation operations of the control ICs CTL1, CTL2. This prevents interference of regulation operations between different systems and eliminates regulation malfunctions due to overheat protection operation, and thereby suppresses fluctuations of output voltages Vo1, Vo2.

Further, in the DC regulated power supply 41, when reverting to a normal state from an overheated state, the DC regulated power supply 41 is able to vary, by the operation of the delay circuit, the timings of reactivating the control ICs CTL1, CTL2 according to the type of load.

[Fourth Embodiment]

The following describes an electrical structure of a DC regulated power supply 51 of the Fourth Embodiment of the present invention. The DC regulated power supply 51 is similar to the foregoing DC regulated power supply 41, and accordingly corresponding elements are given the same reference numerals and explanations thereof are omitted here.

What should be noted about the DC regulated power supply 51 is that input voltage Vin of the power supply is supplied to the power lines L1, L2 via a switch SW, and that the switch SW is controlled by an overheat protection circuit 53. Accordingly, reference voltage sources C1, C2 are installed in control ICs CTL1a, CTL2a, respectively.

Thus, when an overheated state is detected, power is cut off to suspend the regulation operations of the control ICs CTL1a, CTL2a. This prevents interference of regulation operations between the different systems and eliminates regulation malfunctions due to overheat protection operation, and thereby suppresses fluctuations of output voltages Vo1, Vo2.

[Fifth Embodiment]

The following describes an electrical structure of a DC regulated power supply 61 of the Fifth Embodiment of the present invention. The DC regulated power supply 61 is similar to the foregoing DC regulated power supplies 41, 51, and accordingly corresponding elements are given the same reference numerals and explanations thereof are omitted here.

What should be noted about the DC regulated power supply 61 is that switches SW1, SW2 are respectively provided for the power lines L1, L2, and that the switches SW1, SW2 are controlled by an overheat protection circuit 43. In addition, the overheat protection circuit 43 includes a delay circuit, so as to vary ON timings of the switches SW1, SW2 when reverting to normal state from overheated state.

Thus, detecting an overheated state, the overheat protection circuit 43 opens the switches SW1, SW2, so as to suspend the regulation operations of the control ICs CTL1a, CTL2a. This prevents interference of regulation operations between the different systems and eliminates regulation malfunctions due to overheat protection operation, and thereby suppresses fluctuations of output voltages Vo1, Vo2.

Further, in the DC regulated power supply 61, when reverting to a normal state from an overheated state, the DC regulated power supply 43 is able to vary, by the operation of the delay circuit, the timings of reactivating the control ICs CTL1a, CTL2a according to the type of load. Note that, in reactivating the control ICs, the control IC of one system may be activated upon detecting activation of the control IC of the other system.

The foregoing embodiments described the case where the power transistor is a bipolar-type power transistor. However, the type of power transistor is not just limited to this example and other power transistors such as a field-effect power transistor may be used as well.

In order to achieve the foregoing object, a DC regulated power supply of the present invention includes: a power transistor provided for each output of a plurality of systems; a control circuit, which compares a feedback value of an output voltage and a reference voltage from a reference voltage source, and controls a base current of the power transistor according to a difference of the feedback value and the reference voltage, so as to regulate the output voltage; and an overheat protection circuit, which lowers the reference voltage of the reference voltage source upon detecting an overheated state in the power transistor.

With this configuration, a DC regulated power supply of a dropper type can be realized that includes: outputs of multiple systems; a power transistor serially interposed for each output on a power line that connects a DC power supply with a DC load; and a control circuit, which compares a feedback value that is obtained from the output voltage with a reference voltage from a reference voltage source, and controls a base current of the power transistor according to the difference and thereby controls the ON resistance, so as to regulate the output voltage. In the dropper-type DC regulated power supply, in carrying out the overheat protection operation, the overheat protection circuit of the present invention suppresses the output current by lowering the reference voltage. This contrasts to conventional overheat protection circuits, which suppress the base current of the power transistor to suppress the output current.

It is therefore possible to simultaneously suppress the base currents of different systems and eliminate regulation malfunctions in the overheat protection operation, thereby suppressing fluctuations of output voltage. The present invention is particularly suitable in applications where a control circuit with multiple systems are integrated into one chip and packaged into a single package with the power transistor.

In the DC regulated power supply, the reference voltage source may provide a reference voltage for each output of the plurality of systems.

With the foregoing configuration, provided that the differential amplifier that compares the feedback value of the output voltage with the reference voltage in the control circuit of one output system has the same gain as the differential amplifiers of the other systems, by setting different values for the reference voltages of the respective output systems, i.e., by having different feedback voltages, it is possible to cause the output voltages of the respective systems to rise at different timings in reverting from the protected state.

In the DC regulated power supply, the overheat protection circuit may include: a switch provided for a line of a reference voltage of each output of the plurality of systems; and a delay circuit, provided for at least one of the switches, that operates when reverting from the overheated state.

With this configuration, the lines of reference voltages for the respective output systems are separated from one another, and when reverting from an overheated state, the delay circuit delays the ON timing of at least one of the switches. This enables each output system to vary the timing of reactivation according to the type of load.

In order to achieve the foregoing object, another DC regulated power supply of the present invention includes: a power transistor provided for each output of a plurality of systems; a control circuit, which compares a feedback value of an output voltage and a reference voltage from a reference voltage source, and controls a base current of the power transistor according to a difference of the feedback value and the reference voltage, so as to regulate the output voltage;

and an overheat protection circuit, which cuts off a supply line of an input voltage to the power transistor upon detecting an overheated state in the power transistor.

With this configuration, a DC regulated power supply of a dropper type can be realized that includes: outputs of multiple systems; a power transistor serially interposed for each output on a power line that connects a DC power supply with a DC load; and a control circuit, which compares a feedback value that is obtained from the output voltage with a predetermined reference voltage, and controls a base current of the power transistor according to the difference and thereby controls the ON resistance, so as to regulate the output voltage. In the dropper-type DC regulated power supply, in carrying out the overheat protection operation, the overheat protection circuit of the present invention suppresses the output current by cutting off the supply line of an input voltage. This contrasts to conventional overheat protection circuits, which suppress the base current of the power transistor to suppress the output current.

It is therefore possible to suspend the regulation operation of the entire DC regulated power supply, so as to prevent the regulation operation of one system from influencing the regulation operations of the other systems. This eliminates regulation malfunctions in the overheat protection operation, and thereby suppresses fluctuations of output voltage.

In the DC regulated power supply of the present invention, the overheat protection circuit may include: a switch provided for a supply line of each output of the plurality of systems; and a delay circuit, provided for at least one of the switches, that operates when reverting from the overheated state.

With this configuration, the lines of reference voltages for the respective output systems are separated from one another, and when reverting from an overheated state, the delay circuit delays the ON timing of at least one of the switches. This enables each output system to vary the timing of reactivation according to the type of load.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A DC regulated power supply comprising:
   a power transistor provided for each output of a plurality of systems;
   a control circuit, which compares a feedback value of an output voltage and a reference voltage from a reference voltage source, and controls a base current of the power transistor according to a difference of the feedback value and the reference voltage, so as to regulate the output voltage; and
   an overheat protection circuit, which cuts off a supply line of an input voltage to the power transistor upon detecting an overheated state in the power transistor.

2. The DC regulated power supply as set forth in claim 1, wherein:
   the overheat protection circuit includes:
   a switch provided for a supply line of each output of the plurality of systems; and
   a delay circuit, provided for at least one of the switches, that operates when reverting from the overheated state.

3. The DC regulated power supply as set forth in claim 2, wherein the delay circuit varies a timing of reverting from the overheated state with respect to each output of the plurality of systems.

4. The DC regulated power supply as set forth in claim 1, further comprising:
   a temperature detecting element provided for each power transistor.

5. The DC regulated power supply as set forth in claim 1, wherein
   the overheat protection circuit suspends the regulation operation by the control circuit upon detecting the overheated state in the power transistor.

6. The DC regulated power supply as set forth in claim 1, wherein
   the control circuit is powered via the supply line of the input voltage to the power transistor; and
   the overheat protection circuit cuts off the supply line of the input voltage to the control circuit upon detecting the overheated state in the power transistor.

* * * * *

UNITED STATES PATENT AND TRADEMARK OFFICE
CERTIFICATE OF CORRECTION

| | | |
|---|---|---|
| PATENT NO. | : 7,176,666 B2 | |
| APPLICATION NO. | : 11/137343 | |
| DATED | : February 13, 2007 | |
| INVENTOR(S) | : Shinzou Yamamoto | |

It is certified that error appears in the above-identified patent and that said Letters Patent is hereby corrected as shown below:

Page 1, Item (54),
"DC REGULATED POWER SUPPLY COMPRISING"

Page 1, Item (54), please change to read:

--DC REGULATED POWER SUPPLY--

Signed and Sealed this

Twenty-ninth Day of May, 2007

JON W. DUDAS
*Director of the United States Patent and Trademark Office*